(12) United States Patent
Johnson et al.

(10) Patent No.: US 7,199,571 B2
(45) Date of Patent: Apr. 3, 2007

(54) PROBE APPARATUS FOR USE IN A SEPARABLE CONNECTOR, AND SYSTEMS INCLUDING SAME

(75) Inventors: Leonard A. Johnson, Leander, TX (US); Joseph Yossi Harlev, Fort Worth, TX (US); John M. Branning, Jr., Fort Worth, TX (US); Robert D. Elliott, Garland, TX (US)

(73) Assignee: Optisense Network, Inc., Bridgeport, TX (US)

(*) Notice: Subject to any disclaimer, the term of this patent is extended or adjusted under 35 U.S.C. 154(b) by 0 days.

(21) Appl. No.: 10/900,002

(22) Filed: Jul. 27, 2004

(65) Prior Publication Data

US 2006/0022683 A1 Feb. 2, 2006

(51) Int. Cl.
 G01R 19/14 (2006.01)
 G01R 31/04 (2006.01)
 H01R 9/03 (2006.01)

(52) U.S. Cl. .............. 324/133; 324/538; 439/278; 439/279; 439/610

(58) Field of Classification Search .......... 324/725, 324/133; 439/278, 279, 610
See application file for complete search history.

(56) References Cited

U.S. PATENT DOCUMENTS

| | | |
|---|---|---|
| 3,513,394 A | 5/1970 | Tachick |
| 4,152,643 A | 5/1979 | Schweitzer, Jr. |
| 4,251,770 A | 2/1981 | Schweitzer, Jr. |
| 4,263,550 A | 4/1981 | Schweitzer, Jr. |
| 4,794,331 A | 12/1988 | Schweitzer, Jr. |
| 4,814,933 A | 3/1989 | Filter et al. |
| 5,029,273 A | 7/1991 | Jeager |
| 5,077,520 A | 12/1991 | Schweitzer, Jr. |
| 5,892,357 A | 4/1999 | Woods et al. |
| 5,936,395 A | 8/1999 | Kevorkian |
| 5,939,711 A | 8/1999 | Woods et al. |
| 6,016,053 A | 1/2000 | Yakymyshyn |
| 6,031,368 A | 2/2000 | Klippel et al. |
| 6,124,706 A | 9/2000 | Woods et al. |
| 6,127,817 A | 10/2000 | Chatrefou |
| 6,252,388 B1 | 6/2001 | Jaeger |
| 6,307,666 B1 | 10/2001 | Davidson et al. |

(Continued)

FOREIGN PATENT DOCUMENTS

EP  1 391 740 A2  2/2004

OTHER PUBLICATIONS

US 5,731,549, 03/1998, Woods et al. (withdrawn)

*Primary Examiner*—Andrew H. Hirshfeld
*Assistant Examiner*—John Zhu
(74) *Attorney, Agent, or Firm*—Eric Karich

(57) ABSTRACT

A probe apparatus disclosed for use in a separable connector includes an insulating body and spaced apart first and second electrical conductors in contact with the insulating body. The first and second electrical conductors have adjacent surfaces configured such that when an electrical potential is applied between the conductors, an electric field is formed between the conductors. The insulating body has an opening positioned between the conductors and adapted to receive a sensor such that a portion of the sensor is subjected to the electric field. A separable electrical connector system is described including the probe apparatus, as is a voltage sensing system including the probe apparatus and a voltage sensor positioned within the opening of the insulating body.

11 Claims, 9 Drawing Sheets

U.S. PATENT DOCUMENTS

| | | |
|---|---|---|
| 6,362,615 B1 | 3/2002 | Davidson et al. |
| 6,388,434 B1 | 5/2002 | Davidson et al. |
| 6,492,800 B1 | 12/2002 | Woods et al. |
| 6,538,422 B2 | 3/2003 | Potter et al. |
| 6,621,258 B2 | 9/2003 | Davidson et al. |
| 6,744,255 B1 * | 6/2004 | Steinbrecher et al. ....... 324/511 |
| 6,843,685 B1 * | 1/2005 | Borgstrom et al. ......... 439/606 |

* cited by examiner

PROBE APPARATUS FOR USE IN A SEPARABLE CONNECTOR, AND SYSTEMS INCLUDING SAME

CROSS-REFERENCE TO RELATED APPLICATIONS

Not Applicable

STATEMENT REGARDING FEDERALLY SPONSORED RESEARCH

Not Applicable

BACKGROUND OF THE INVENTION

1. Field of the Invention:

This invention relates generally to sensor probe apparatus, and more particularly to probe apparatus for sensing voltage via an electric field.

2. Description of Related Art:

In electrical power generation and distribution systems, high voltages (e.g., 2,000 volts and above) are commonly measured via instrument transformers mounted on poles. In addition to being relatively large and heavy, these devices have substantially limited dynamic range, bandwidth, linearity, and electrical isolation. Further, during electrical fault conditions, these transformers can conduct dangerous levels of fault energy to downstream instrumentation and personnel, thus creating safety hazards for personnel working on and around the voltage sensing systems.

In an effort to reduce or eliminate these problems, a variety of alternate high voltage sensors have been developed. Most of the alternate high voltage sensors include capacitive or resistive voltage divider networks that require direct electrical contact with an energized conductor. This direct electrical contact with an energized conductor presents a safety hazard for personnel working on and around voltage sensing systems including the sensors.

In U.S. Pat. No. 5,892,357, Woods et al. disclose an electro-optic voltage sensor for sensing voltage via an electric field. The electro-optic voltage sensor advantageously does not require electrical contact with an energized conductor. The galvanically isolated output of the voltage sensor makes a voltage sensing system employing the sensor intrinsically safe for personnel working on and around the system.

It would be beneficial to have a probe apparatus for sensors such as the electro-optic voltage sensor of Woods et al. that would allow the sensors to be easily integrated into existing types of power transmission and distribution equipment. Such a probe apparatus may advantageously form a part of a separable connector.

SUMMARY OF THE INVENTION

A probe apparatus disclosed for use in a separable connector includes an insulating body and spaced apart first and second electrical conductors in contact with the insulating body. The first and second electrical conductors have adjacent surfaces configured such that when an electrical potential is applied between the conductors, an electric field is formed between the conductors. The insulating body has an opening positioned between the conductors and adapted to receive a sensor such that a portion of the sensor is subjected to the electric field. A separable electrical connector system is described including the probe apparatus, as is a voltage sensing system including the probe apparatus and a voltage sensor positioned within the opening of the insulating body.

Other features and advantages of the present invention will become apparent from the following more detailed description, taken in conjunction with the accompanying drawings, which illustrate, by way of example, the principles of the invention.

BRIEF DESCRIPTION OF THE DRAWING

The accompanying drawings illustrate the present invention. In such drawings.

DETAILED DESCRIPTION OF THE INVENTION

Figure 1:
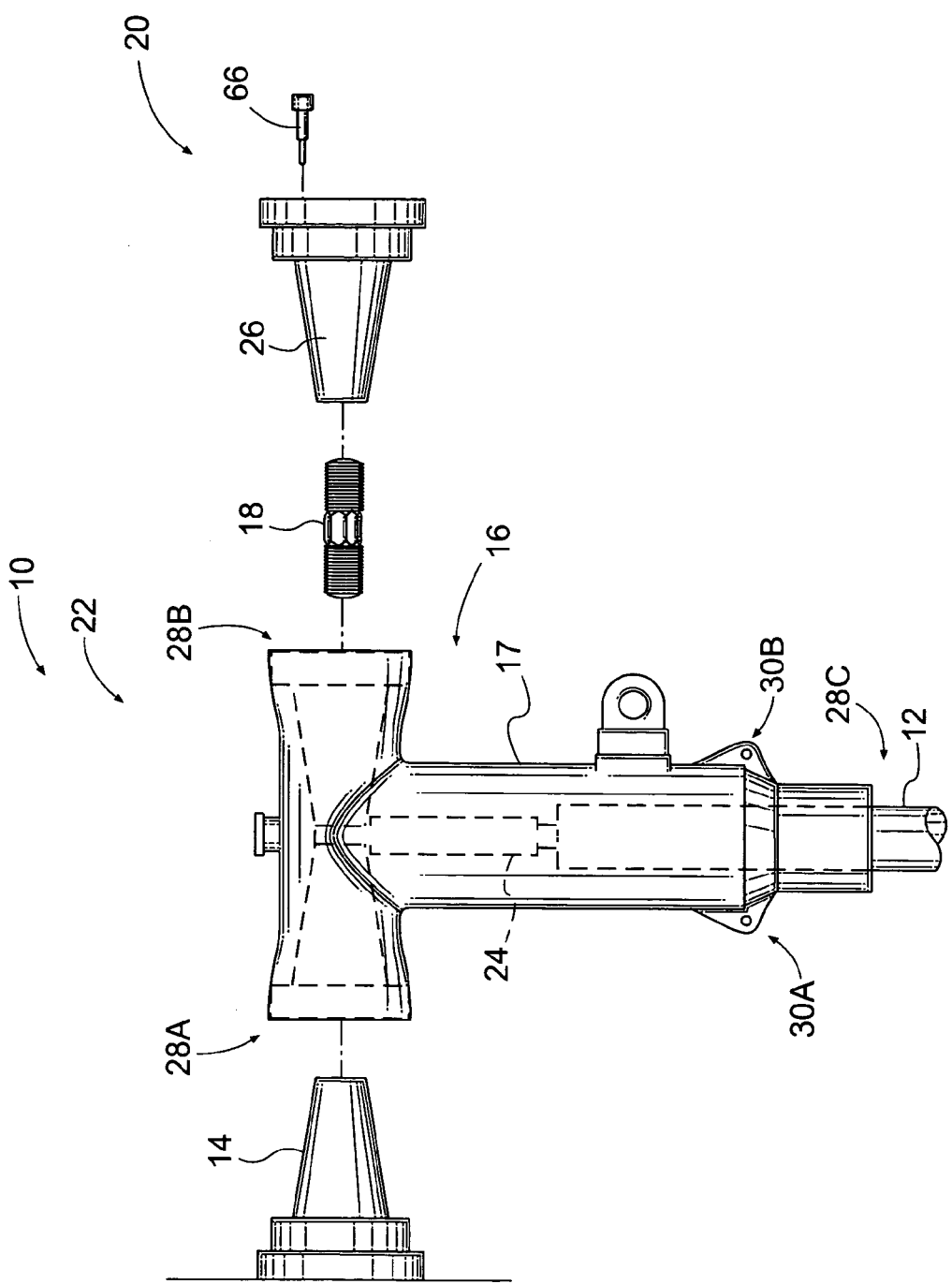
FIG. 1 is a side view of one embodiment of a separable electrical connector system including a probe apparatus.

FIG. 1 is a side view of one embodiment of a separable electrical connector system 10 that includes a probe apparatus 20 of the present invention. The probe apparatus 20 includes an insulating body 26 and a sensor 66 that is adapted to fit within the insulating body 26 to measure the voltage of a cable 12 adjacent the probe apparatus 20.

In one embodiment, the connector system 10 includes a connector (i.e., T-connector) 16, a stud 18 having opposed threaded ends, and the probe apparatus 20. In combination, the T-connector 16, the stud 18, and the probe apparatus 20 form a separable connector 22 for connecting the cable 12 to the apparatus bushing 14.

In general, the T-connector 16 has a central conductor 24 positioned within a "T"-shaped second insulating body 17. The second insulating body 17 may have a plurality of openings, in this case three openings 28A–28C. In this embodiment, openings 28A and 28B are opposed and coaxial as shown in FIG. 1; however, other arrangements of openings are also within the scope of the claimed invention. In this embodiment, the opening 28A is adapted to receive the bushing 14, and the opening 28B is adapted to receive the probe apparatus 20. The openings 28A and 28B of the T-connector 16 are preferably standard interfaces that meet the requirements of IEEE standard 386-1995 entitled "Standard for Separable Insulated Connector Systems for Power Distribution Systems Above 660 V."

The central conductor 24 has two opposed ends. One end of the central conductor 24 is positioned between the openings 28A and 28B and has a hole passing therethrough. The hole is dimensioned to allow the stud 18 to pass through the hole. The other end of the central conductor 24 extends into the opening 28C and is adapted for connecting to a central conductor of the cable 12. The opening 28C is adapted to receive the cable 12.

In the embodiment of FIG. 1, the second insulating body 17 has an outer electrically conductive layer formed over an inner electrically insulating bulk. Tabs 30A and 30B extending from the insulating body 26 are provided for connecting the outer electrically conductive layer to a reference ground electrical potential for safety purposes.

Suitable T-connectors are known and include the Bolted Tee Connector model I550-30 manufactured by Cooper Power Systems, a subsidiary of Cooper Industries Ltd., Houston, Tex. Such commercially available T-connectors employ insulating plugs for making electrical connections, and the probe apparatus 20 may be used in place of the insulating plugs.

Forming a part of a separable connector such as the separable electrical connector system 10, or substituted for an insulating plug normally used with a commercially available T-connector, the probe apparatus 20 allows a sensor to be integrated into existing types of power transmission and distribution equipment with relative ease.

While one type of connector 16 has been described in detail, the connector 16 is not strictly limited to this "T-type" connector, but could also include alternative connectors well known in the art, and the scope of the claimed invention should be construed to include such alternative connectors, fittings, or other similar elements in the power transmission system.

Figure 2A:
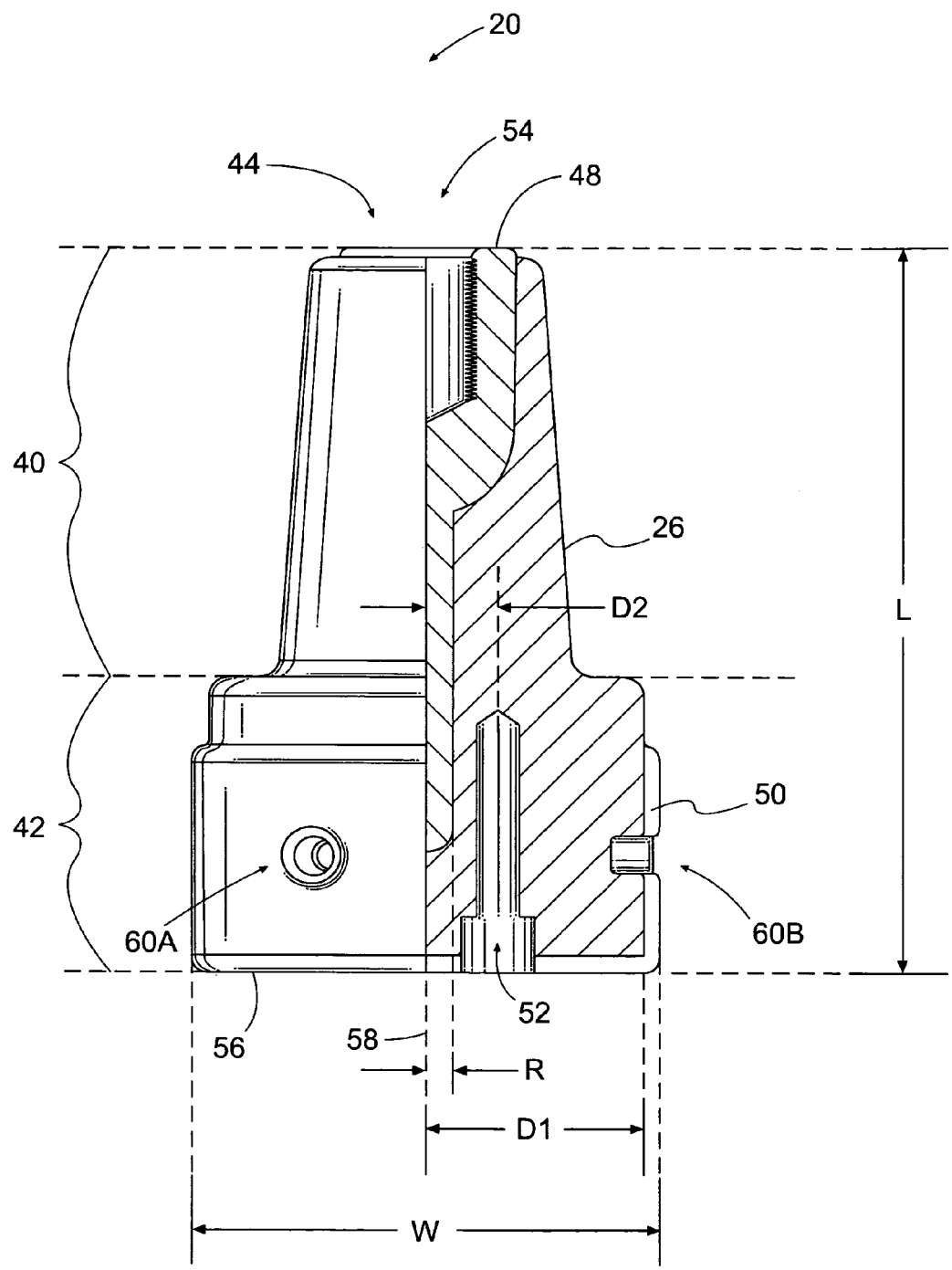
FIG. 2A is a side view of one embodiment of the probe apparatus of FIG. 1 wherein an interior of a portion of the probe apparatus is also shown, and wherein the probe apparatus includes an opening positioned between two electrical conductors.

FIG. 2A is a side view of one embodiment of the probe apparatus 20 of FIG. 1 wherein an interior of a portion of the probe apparatus 20 is also shown. In this embodiment, the insulating body 26 includes a tapered nose portion 40 extending from a substantially disc-shaped base portion 42. The nose portion 40 tapers to a blunt peak 44 opposite the base portion 42.

The probe apparatus 20 further includes a first electrical conductor 48, and a second electrical conductor 50 spaced apart from the first electrical conductor 48. As described in detail below, the electrical conductors 48 and 50 are in contact with the insulating body 26 and having adjacent surfaces configured such that when an electrical potential is applied between the electrical conductors 48 and 50, an electric field is formed between the first and second electrical conductors. The insulating body 26 has an opening 52 positioned between the electrical conductors 48 and 50 and adapted to receive the sensor 66 (shown in FIG. 2B) such that a portion of the sensor 66 is subjected to the electric field.

In the embodiment of FIG. 2A, the insulating body 26 is made of an electrically insulating material such as, for example, ethylene propolyne diene monomer (EPDM) rubber or an electrically insulating epoxy, although other materials could also be used.

The first electrical conductor 48 is formed from an electrically conductive material, for example a metal such as aluminum. In this embodiment, the conductor 48 is substantially rod-shaped, and has two opposed ends. One end of the conductor 48 extends from the blunt peak 44 of the nose portion 40, and has a threaded opening 54 to receive a threaded end of the stud 18 of FIG. 1. The other end of the conductor 48 is cylindrical and extends into the base portion 42.

In the embodiment of FIG. 2A, the second electrical conductor 50 is a layer of a substantially conductive material formed on an outer surface of the insulating body 26 at the base portion 42. The second electrical conductor 50 may be formed, for example, by adding electrically conductive particles to EPDM rubber, and coating the outer surface of the insulating body 26 at the base portion 42 with the resulting electrically conductive EPDM rubber compound.

In the embodiment of FIG. 2A, the opening 52 is formed in a bottom surface 56 of the insulating body 26. The end of the conductor 48 extending into the base portion 42 and a portion of the conductor 50 covering the curved side surface of the insulating body 26 in the base portion 42 are cylindrical and coaxial. The cylindrical end of the conductor 48 extending into the base portion 42 has a radius "R" about an axis 58. An inner surface of the portion of the conductor 50 covering the curved side surface of the insulating body 26 in the base portion 42 is a radial distance "D1" from the axis 58, and the opening 52 has an axis that is a radial distance "D2" from the axis 58.

When the sensor 66 is mounted in the opening 52 and an electrical potential is applied between the spaced conductors 48 and 50, an electric field is created between the conductors 48 and 50. The electric field is substantially uniform at fixed radial distances about the cylindrical end of the conductor 48 extending into the base portion 42. As described in detail below, the dimensions R, D1, and D2 are selected such that the magnitude of the electric field experienced by a sensing portion of the sensor 66 (shown in FIG. 2B) is within a measurement range of the sensor 66.

In the embodiment of FIG. 2A, the probe apparatus 20 has a length dimension "L" of about 5.49 inches, and a width dimension "W" of approximately 3.25 inches.

In the embodiment of FIG. 2A, 3 openings are formed in the curved outer surface of the base portion 42 at spaced distances about the outer surface. Two of the 3 openings are visible in FIG. 2A, and are labeled 60A and 60B. Each of the 3 openings is adapted to receive a hooked end of a spanner wrench used to turn the probe apparatus 20 to tighten (or loosen) the electrical connection made using the separable connector 22 of FIG. 1. Herein below, the 3 openings, including the openings 60A and 60B, will be referred to collectively as "the openings 60."

Figure 2B:
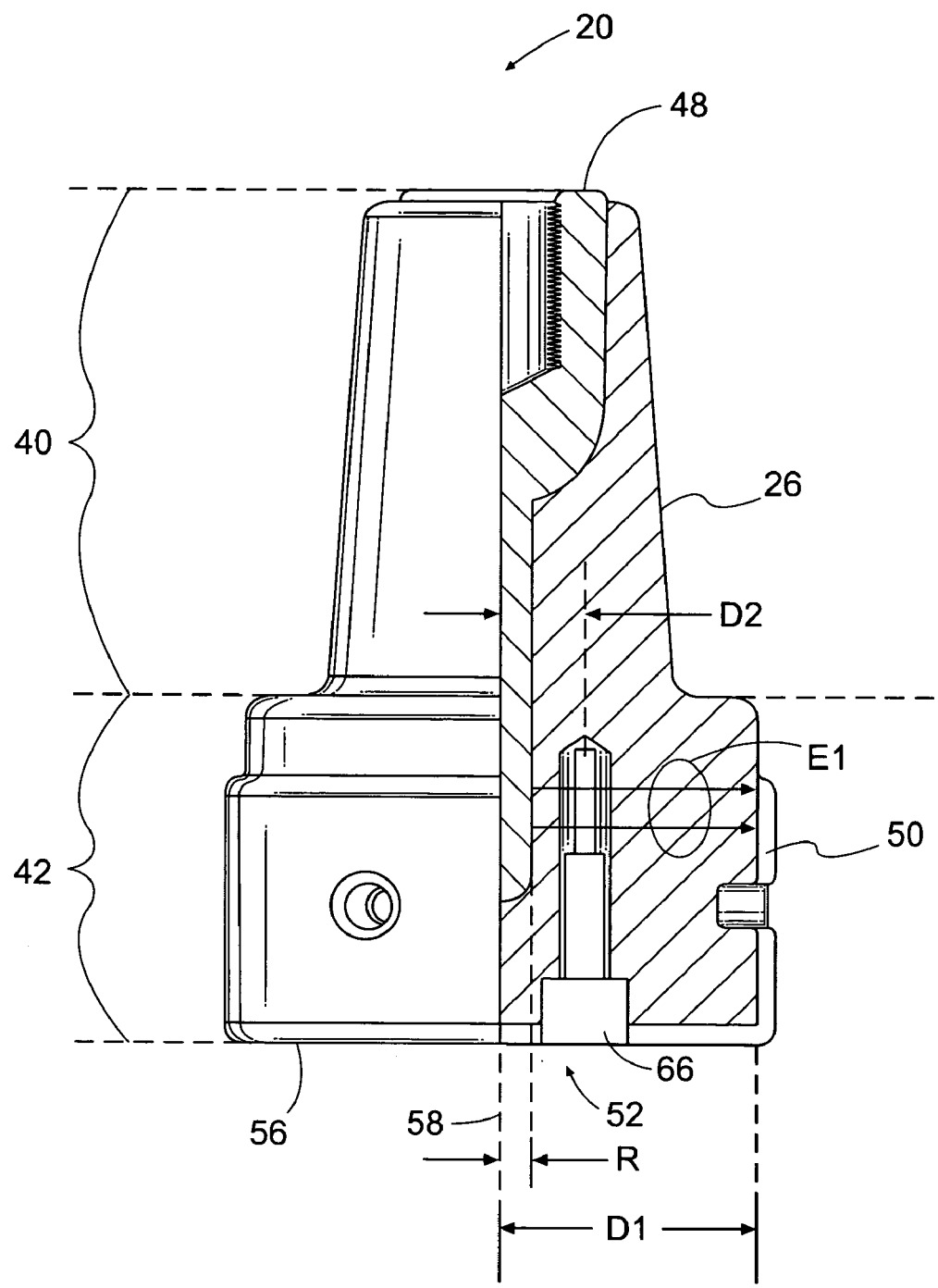
FIG. 2B is a side view of the probe apparatus of FIG. 2A illustrating a condition existing within the probe apparatus when a sensor is mounted in the opening and an electrical potential is applied between the conductors.

FIG. 2B is a side view of the probe apparatus 20 of FIG. 2A illustrating a condition existing within the probe apparatus 20 when a sensor 66 is mounted in the opening 52 and an electrical potential is applied between the conductors 48 and 50. As described above, an electric field is formed between the spaced apart conductors 48 and 50, wherein the electric field is substantially uniform at fixed radial distances about the cylindrical end of the conductor 48 extending into the base portion 42.

As shown in FIG. 2B and described above, the cylindrical end of the conductor 48 extending into the base portion 42 has a radius "R" about an axis 58. An inner surface of the portion of the conductor 50 covering the curved side surface of the insulating body 26 in the base portion 42 is a radial distance "D1" from the axis 58, and the opening 52 has an axis that is a radial distance "D2" from the axis 58.

In FIG. 2B a portion of the electric field labeled "E1" passes through a sensing portion of the sensor 66. When the magnitude of the electrical potential applied between the conductors 48 and 50 is "V," the sensing portion of the sensor 66 is theoretically subjected to a substantially uniform portion of the electric field having a magnitude |E| given by:

$$|E| = \left(\frac{V}{D2}\right)\left[\frac{1}{\ln(D1/R)}\right]$$

The dimensions R, D1, and D2 are selected such that the magnitude |E| of the electric field experienced by the sensing portion of the sensor 66 is within a measurement range of the sensor 66.

The sensor 66 preferably produces a signal dependent upon a magnitude of an electric field to which the sensor 66 is subjected. As the magnitude of the electric field is dependent upon the magnitude of the electrical potential applied between the conductors 48 and 50, the signal produced by the sensor 66 is indicative of the magnitude of the electrical potential. The sensor 66 is preferably an electro-optic sensor. In the embodiment of FIG. 2B, a base portion of the sensor 66 is mounted in a mouth of the opening 52. The sensor 66 may, for example, receive excitation energy and produce the signal at the base portion. The sensor 66 may be, for example, an electro-optic sensor that receives light energy. The light energy may be reflected within the sensor 66 such that the light energy passes through the sensing portion of the sensor 66 twice.

For example, the sensor 66 may be an electro-optic voltage sensor including transmitting means, sensing means, reflector means, and detecting means. The transmitting means may be configured to transmit a beam of polarized electromagnetic radiation having two components propagating along orthogonal planes. The sensing means may be subjected to the portion of the electric field E1 and configured to induce a differential phase shift in the orthogonal beam components dependent upon the magnitude of the portion of the electric field E1. The reflector means may receive the beam after passing through the sensing means and direct the beam back through the sensing means. The detecting means may detect the differential phase shift of the orthogonal beam components and produce the signal dependent upon the differential phase shift. A suitable electro-optic voltage sensor is disclosed in U.S. Pat. No. 5,892,357 issued to Woods et al., the contents of which are hereby incorporated by reference in full.

In the embodiment of FIG. 2B, the intensity of the electric field formed between the spaced apart conductors 48 and 50 may be sufficient to cause corona discharge within any air-filled voids. To avoid such deleterious ionization, the space between the sensor 66 and inner walls of the opening 52 may be filled with a high dielectric strength compound. To maintain the strength and uniformity of the electric field, the compound preferably has a dielectric constant closely approximating that of the material from which the insulating body 26 is made. Displacing air in the space between the sensor 66 and inner walls of the opening 52, the compound prevents dielectric breakdown caused by corona discharge, thereby promoting long-term reliability of the probe apparatus 20. A suitable compound is the Sylgard® 527 silicone dielectric gel manufactured the Dow Corning Corporation (Midland, Mich.). The flexibility of the Sylgard® 527 silicone dielectric gel advantageously ensures the dielectric material does not assert physical force on the sensor 66 that may adversely affect sensor accuracy.

Figure 3A:
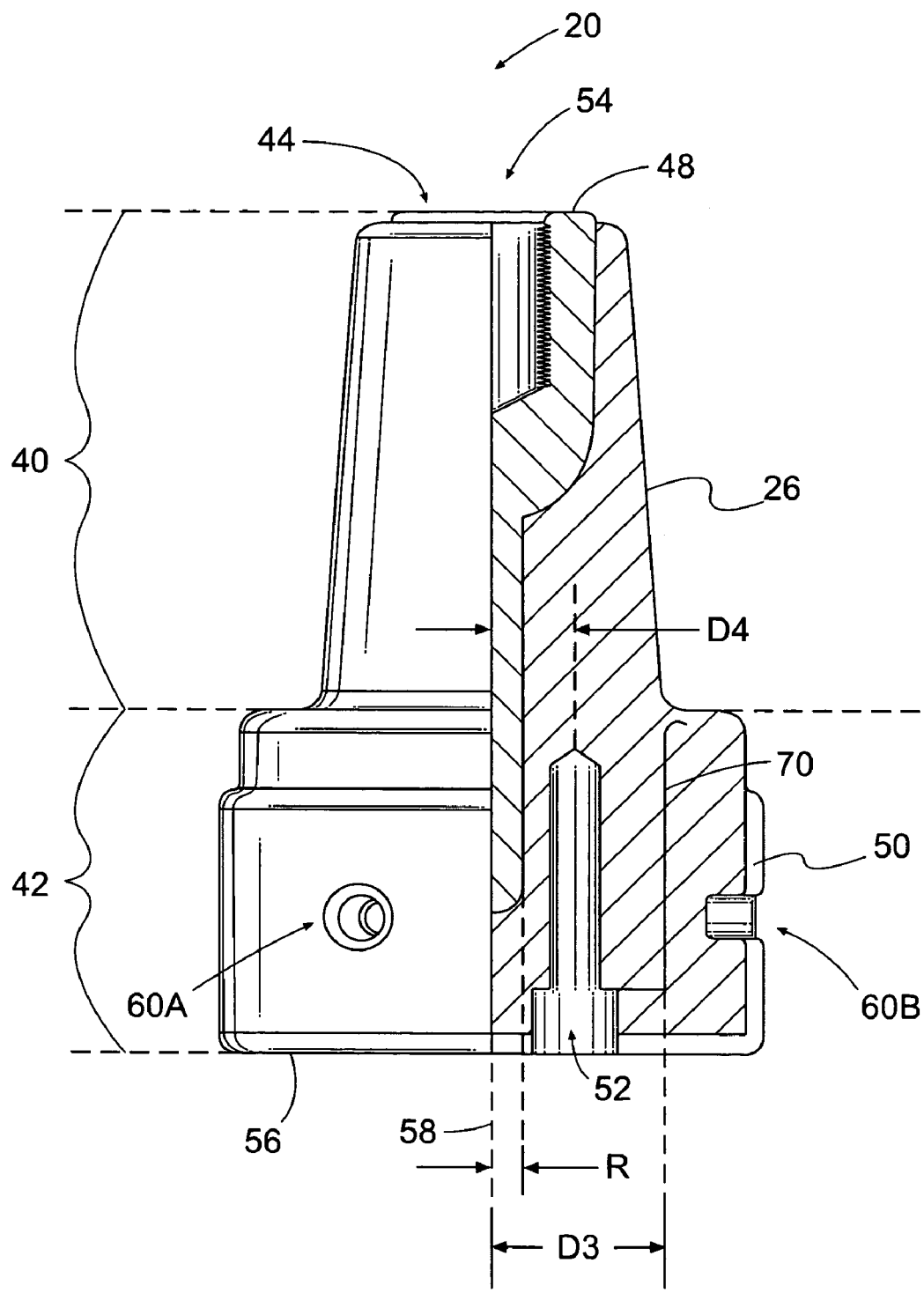
FIG. 3A is a side view of another embodiment of the probe apparatus of FIG. 1 wherein an interior of a portion of the probe apparatus is also shown, and wherein one of the two conductors has a tubular portion positioned about the other conductor.

FIG. 3A is a side view of another embodiment of the probe apparatus 20 of FIG. 1 wherein an interior of a portion of the probe apparatus 20 is also shown. Components of the probe apparatus 20 shown in FIGS. 2A and 2B and described above are labeled similarly in FIG. 3A.

In the embodiment of FIG. 3A, the probe apparatus 20 includes a third cup-shaped electrical conductor 70 within the insulating body 26 and positioned about the end of the conductor 48 in the base portion 42 of the probe apparatus 20. In a preferred embodiment, the electrical conductor 70 is formed from electrically conductive screen material. The electrical conductor 70 is electrically connected to the conductor 50.

In the embodiment of FIG. 3A, the opening 52 is again formed in the bottom surface 54 of the probe apparatus 20. The end of the conductor 48 extending into the base portion 42 and a vertical portion of the conductor 70 are cylindrical and coaxial. The cylindrical end of the conductor 48 extending into the base portion 42 has a radius "R" about an axis 58. An inner surface of the vertical portion of the conductor 70 is a radial distance "D3" from the axis 58, and the opening 52 has an axis that is a radial distance "D4" from the axis 58.

When a sensor is mounted in the opening 52 and an electrical potential is applied between the spaced conductors 48 and 70, an electric field is created between the conductors 48 and 70. The electric field is substantially uniform at fixed radial distances about the cylindrical end of the conductor 48 extending into the base portion 42. As described in detail below, the dimensions R, D3, and D4 are selected such that the magnitude of the substantially uniform portion of the electric field experienced by the sensing portion of the sensor is within a measurement range of the sensor.

Figure 3B:
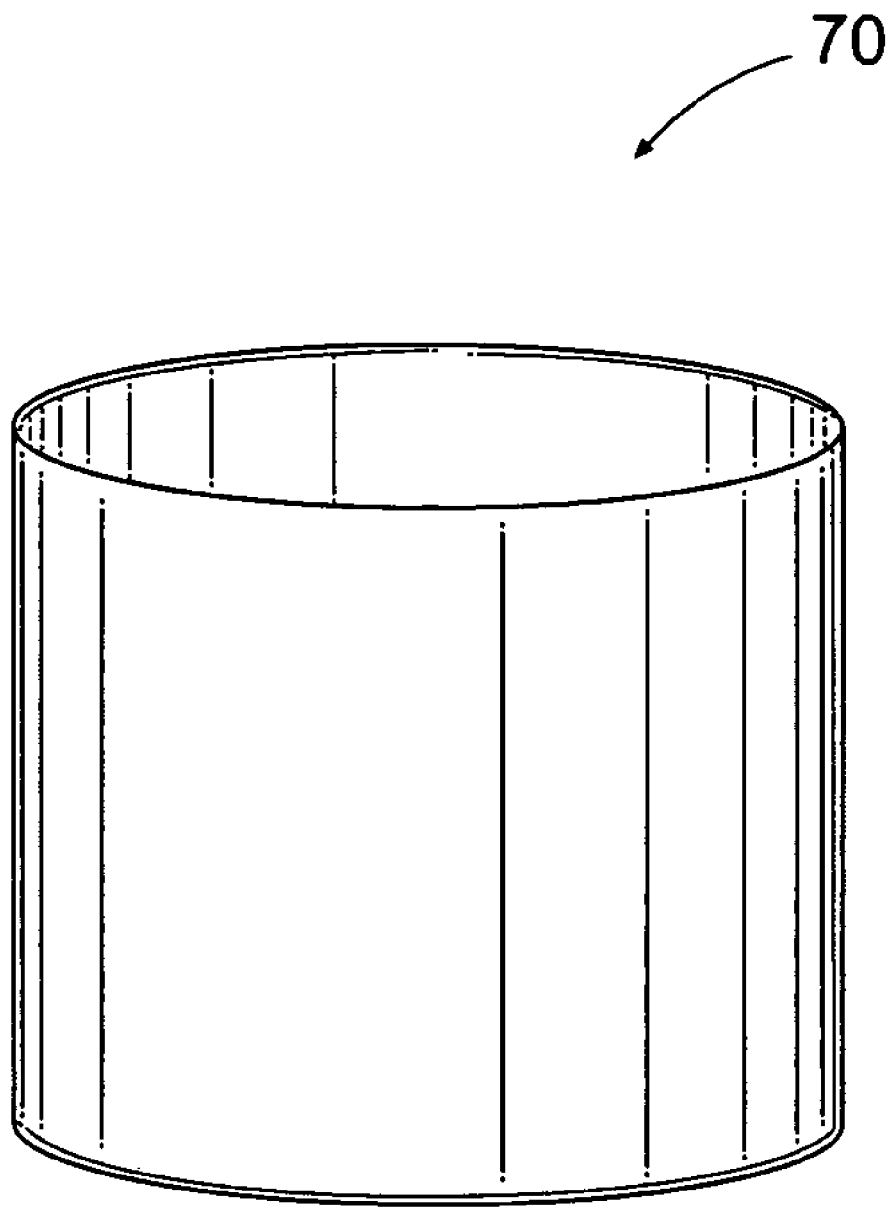
FIG. 3B is a perspective view of one embodiment of the conductor having the tubular portion.

FIG. 3B is a perspective view of one embodiment of the conductor 70 of FIG. 3A. The conductor 70 may be formed from an electrically conductive mesh or screen material.

Figure 3C:
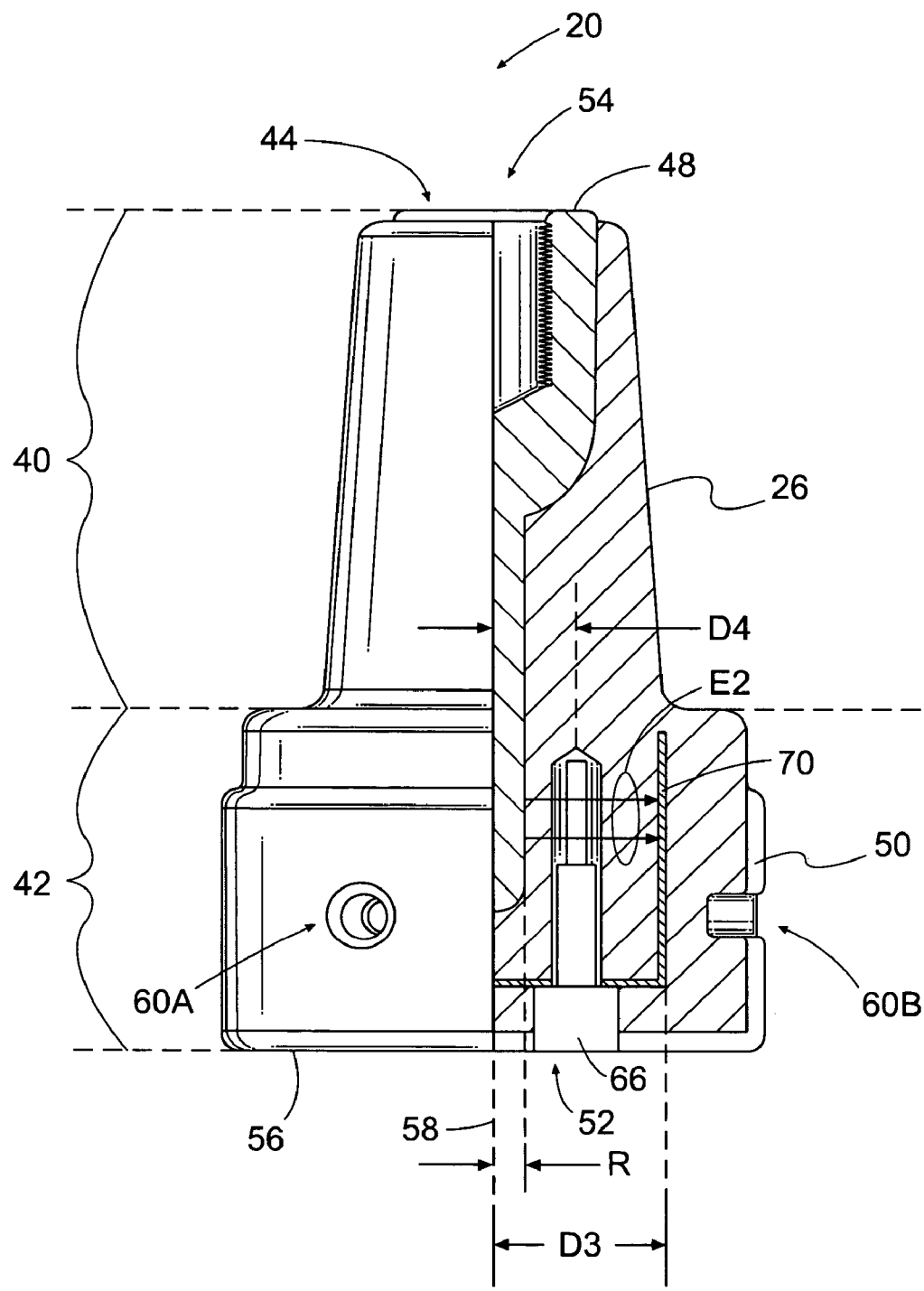
FIG. 3C is a side view of the probe apparatus of FIG. 3A illustrating a condition existing within the probe apparatus when a sensor is mounted in the opening and an electrical potential is applied between the conductors.

FIG. 3C is a side view of the probe apparatus 20 of FIG. 3A illustrating a condition existing within the probe apparatus 20 when the sensor 66 is mounted in the opening 52 and an electrical potential is applied between the conductors 48 and 70. As described above, an electric field is formed between the spaced apart conductors 48 and 70, wherein the electric field is substantially uniform at fixed radial distances about the cylindrical end of the conductor 48 extending into the base portion 42.

As shown in FIG. 3C and as described above, the cylindrical end of the conductor 48 extending into the base portion 42 has a radius "R" about an axis 58. An inner surface of the vertical portion of the conductor 70 is a radial distance "D3" from the axis 58, and the opening 52 has an axis that is a radial distance "D4" from the axis 58.

In FIG. 3C a portion of the electric field labeled "E2" passes through the sensing portion of the sensor 66. When the magnitude of the electrical potential applied between the conductors 48 and 70 is "V," the sensing portion of the sensor 66 is theoretically subjected to a substantially uniform portion of the electric field having a magnitude |E| given by:

$$|E| = \left(\frac{V}{D4}\right)\left[\frac{1}{\ln(D3/R)}\right]$$

The dimensions R, D3, and D4 are selected such that the magnitude |E| of the electric field experienced by the sensing portion of the sensor 66 is within a measurement range of the sensor 66.

It is noted that the electric field formed between the conductors 48 and 70 advantageously does not extend outside of the conductor 70, and is thus expectedly not influenced by forces exerted on the openings 60 to turn the probe apparatus 20 to tighten (or loosen) the electrical connection made using the separable connector 22 of FIG. 1.

The intensity of the electric field formed between the spaced apart conductors 48 and 70 may be sufficient to cause corona discharge within any air-filled voids. As described above, the space between the sensor 66 and inner walls of the opening 52 may be advantageously filled with a high dielectric strength compound that prevents such deleterious ionization.

Figure 4A:
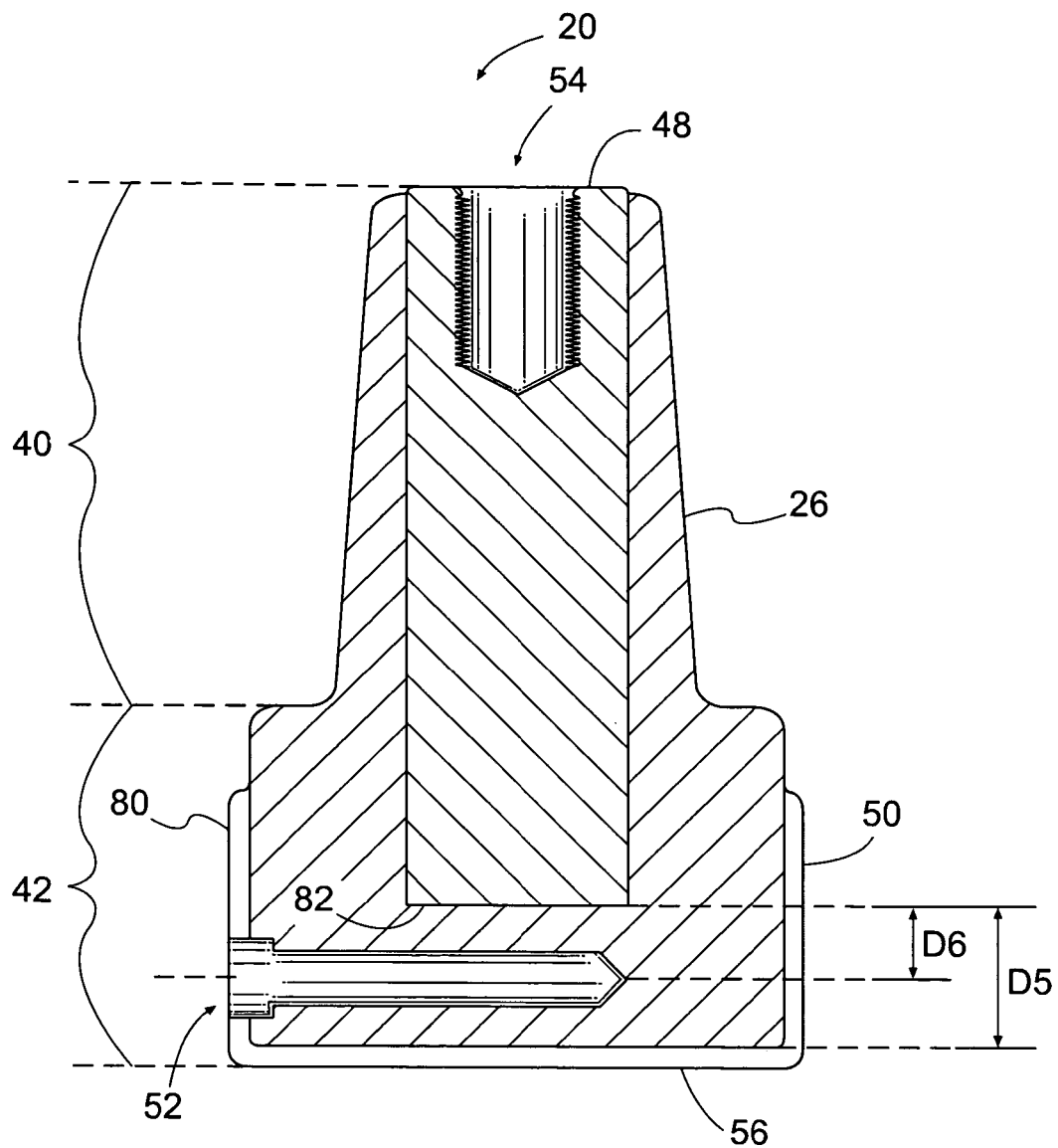
FIG. 4A is a side view of another embodiment of the probe apparatus of FIG. 1 wherein an interior of the probe apparatus is shown.

FIG. 4A is a side view of another embodiment of the probe apparatus 20 of FIG. 1 wherein an interior of the probe apparatus 20 is shown. Components of the probe apparatus 20 shown in FIGS. 2A and 2B and described above are labeled similarly in FIG. 4A. In the embodiment of FIG. 4A, the opening 52 is formed in a side surface 80 of the probe apparatus 20. An end 82 of the conductor 48 within the base portion 42 is substantially flat. An outer surface of the end 82 and an adjacent portion of the conductor 50 are spaced apart by a distance "D5," and a distance "D6" exists between an axis of the opening 52 and the outer surface of the adjacent end 82 of first electrical conductor 48.

When a sensor is mounted in the opening 52 and an electrical potential is applied between the conductors 48 and 50, the sensor is subjected to a substantially uniform electric field formed between the conductors 48 and 50. As described in more detail below, a magnitude of the electric field is dependent on the distance D5 and is independent of the distance D6. The distance D5 is selected such that the magnitude of the electric field experienced by the sensor is within a measurement range of the sensor.

Figure 4B:
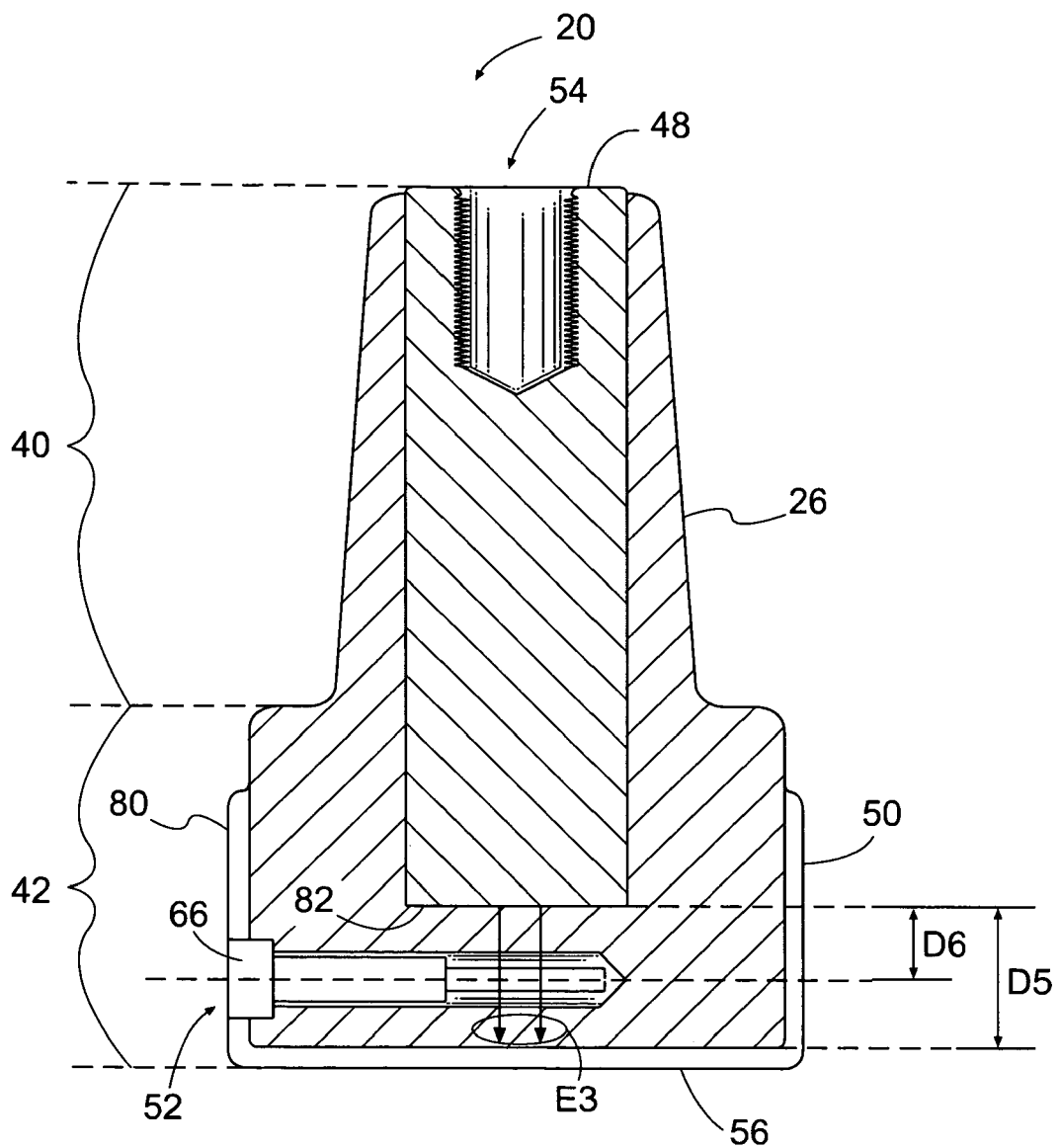
FIG. 4B is a side view of the probe apparatus of FIG. 4A illustrating a condition existing within the probe apparatus when a sensor is mounted in the opening and an electrical potential is applied between the conductors.

FIG. 4B is a side view of the probe apparatus 20 of FIG. 4A illustrating a condition existing within the probe apparatus 20 when the sensor 66 is mounted in the opening 52 and an electrical potential is applied between the conductors 48 and 50. As described above, an electric field is formed between the spaced apart conductors 48 and 50.

As shown in FIG. 4B and described above, the outer surface of the end 82 of the conductor 48 and the adjacent portion of the conductor 50 are spaced apart by the distance D5, and the distance D6 exists between the axis of the opening 52 and the outer surface of the adjacent end 82 of first electrical conductor 48.

In FIG. 4B a portion of the electric field labeled "E3" passes through the sensing portion of the sensor 66. When the magnitude of the electrical potential applied between the conductors 48 and 50 is "V," the sensing portion of the sensor 66 is theoretically subjected to a substantially uniform electric field having a magnitude |E| given by:

$$|E| = \left(\frac{V}{D5}\right).$$

The distance D5 is selected such that the magnitude |E| of the electric field experienced by the sensing portion of the sensor 66 is within a measurement range of the sensor 66.

In the embodiment of FIG. 4B, the distance D6 is selected mainly for manufacturing and mechanical considerations. Where the insulating body 26 is molded, it is important to achieve an adequate distance between the opening 52 and the conductors 48 and 50 to minimize possible problems such as entrapment of air bubbles in the molding material. An adequate distance must also be achieved between the opening 52 and the conductors 48 and 50 for mechanical reasons to prevent stress cracking of the material in these regions.

In the embodiment of FIG. 4B, the intensity of the electric field formed between the spaced apart conductors 48 and 50 may be sufficient to cause corona discharge within any air-filled voids. As described above, the space between the sensor 66 and inner walls of the opening 52 may be advantageously filled with a high dielectric strength compound that prevents such deleterious ionization.

Figure 5:
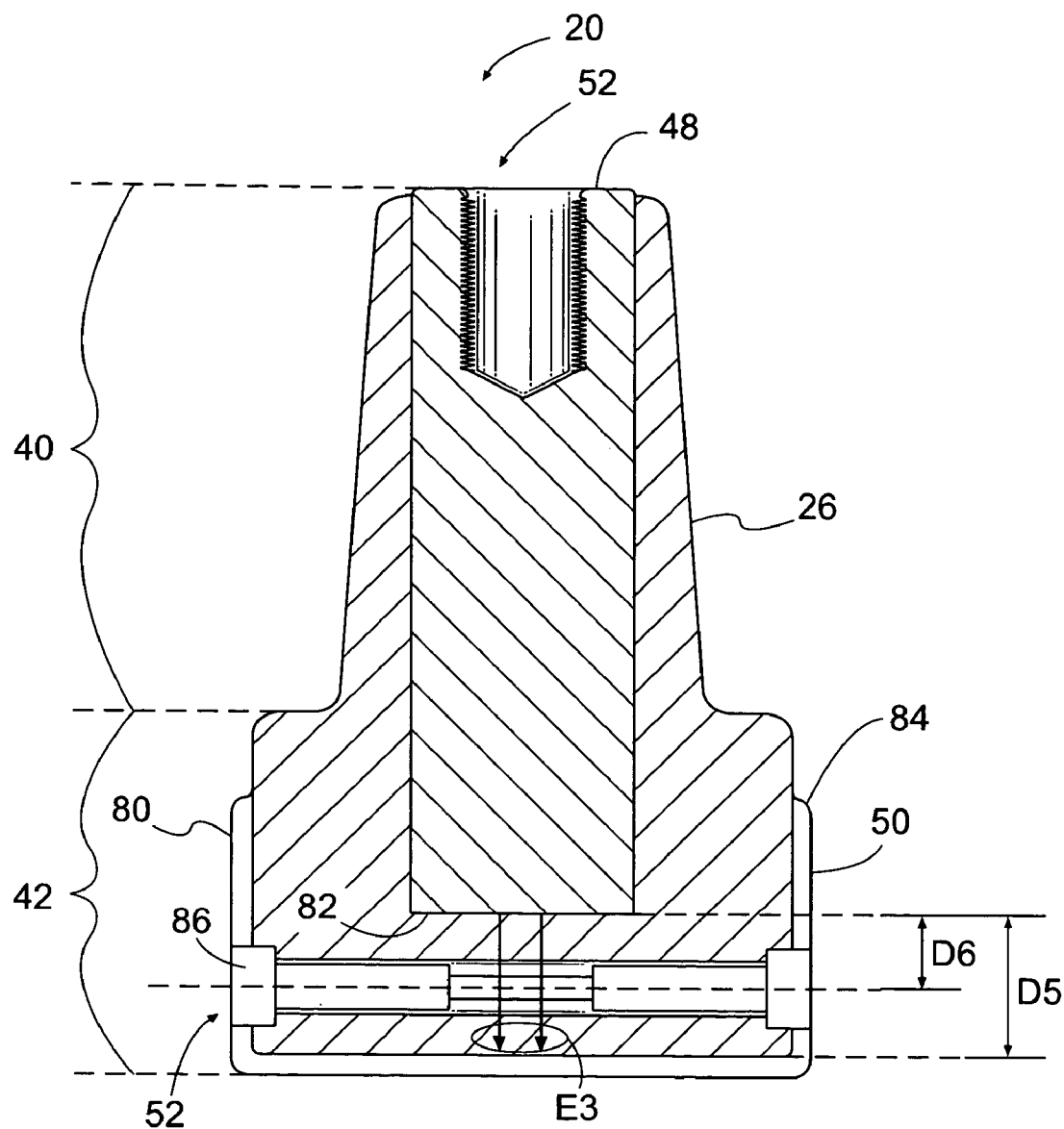
FIG. 5 is a side view of the probe apparatus of FIG. 1 illustrating yet another embodiment of the probe apparatus.

FIG. 5 is a side view of the probe apparatus 20 of FIG. 1 illustrating yet another embodiment of the probe apparatus 20. Components of the probe apparatus 20 shown in FIG. 4A and described above are labeled similarly in FIG. 5. In the embodiment of FIG. 5, the opening 52 extends all the way through the base portion 42 from the side surface 80 to an opposite side surface 84.

A sensor 86 is mounted in the opening 52, extends through the base portion 42, and has two opposed ends. Like the sensor 66 described above, the sensor 86 preferably produces a signal dependent upon a magnitude of an electric field to which the sensor 86 is subjected. As the magnitude of the electric field is dependent upon the magnitude of the electrical potential applied between the conductors 48 and 50, the signal produced by the sensor 86 is indicative of the magnitude of the electrical potential.

The sensor 86 may, for example, receive excitation energy at one end and produce the signal at the opposite end. The sensor 86 may be, for example, an electro-optic sensor that receives light energy at one end and produces the signal at the other end. In this situation, the light may pass through a sensing portion of the sensor 86 a single time.

In FIG. 5 an electrical potential is applied between the conductors 48 and 50. As a result, a substantially uniform electric field is formed between the spaced apart conductors 48 and 50. For the reasons described above, when the magnitude of the electrical potential applied between the conductors 48 and 50 is "V," the sensing portion of the sensor 86 is theoretically subjected to a substantially uniform electric field having a magnitude |E| given by:

$$|E| = \left(\frac{V}{D5}\right).$$

The distance D5 is selected such that the magnitude |E| of the electric field experienced by the sensing portion of the sensor 86 is within a measurement range of the sensor 86.

In the embodiment of FIG. 5, the intensity of the electric field formed between the spaced apart conductors 48 and 50 may be sufficient to cause corona discharge within any air-filled voids. As described above, the space between the sensor 66 and inner walls of the opening 52 may be advantageously filled with a high dielectric strength compound that prevents such deleterious ionization.

In FIGS. 2B, 3D, 4B, and 5, the sensor 66 is a voltage sensor, and is positioned in the opening 52 of the probe apparatus 20 forming several different voltage sensing systems. The voltage sensing systems may also include other elements of the separable electrical connector system 10 of FIG. 1.

While the invention has been described with reference to at least one preferred embodiment, it is to be clearly understood by those skilled in the art that the invention is not limited thereto. Rather, the scope of the invention is to be interpreted only in conjunction with the appended claims.

What is claimed is:

1. A probe apparatus adapted to receive a sensor that is adapted to measure a voltage of a cable based upon a magnitude of an electrical field, the probe apparatus comprising:
    an insulating body;
    spaced apart first and second electrical conductors in contact with the insulating body and having adjacent surfaces configured such that when an electrical potential is applied between the first and second electrical conductors, a substantially uniform electric field is formed between the first and second electrical conductors, the first and second conductor being spaced apart by a distance such that the substantially uniform electric field formed therebetween is within the measurement range of the sensor;
    a conductor adapted to electrically connect the first electrical conductor and the cable, the conductor including a stud adapted to engage the first electrical conductor; and
    an opening in the insulating body between the first and second electrical conductors adapted to receive the sensor.

2. The probe apparatus as recited in claim 1, further comprising a sensor configured to produce a signal dependent upon a magnitude of the electric field, the sensor being adapted to engage the opening such that the sensor is subjected to the electric field.

3. The probe apparatus as recited in claim 2, wherein the sensor is an electro-optic voltage sensor and wherein the magnitude of the electric field is proportional to a magnitude of the electrical potential such that the signal produced by the electro-optic voltage sensor is indicative of the magnitude of the electrical potential.

4. The probe apparatus as recited in claim 1, wherein the insulating body comprises a projection adapted to fit into an opening of a separable connector.

5. The probe apparatus as recited in claim 1, wherein the first electrical conductor is substantially positioned within the insulating body and comprises two opposed ends, wherein one of the two ends is adapted to receive the stud, and wherein the other end resides within the insulating body.

6. The probe apparatus as recited in claim 5, wherein the opening is a cavity, and wherein an axis of the cavity is substantially parallel to an axis of first electrical conductor.

7. The probe apparatus as recited in claim 5, wherein the opening is a cavity, and wherein an axis of the cavity is substantially perpendicular to an axis of first electrical conductor.

8. A separable connector adapted to measure a voltage of a cable, the separable connector comprising:
    a probe apparatus, comprising:
        an insulating body;
        an electro-optic voltage sensor;
        spaced apart first and second electrical conductors in contact with the insulating body and having adjacent surfaces configured such that when an electrical potential is applied between the first and second electrical conductors, a substantially uniform electric field is formed between the first and second electrical conductors, the first and second conductor being spaced apart by a distance such that the substantially uniform electric field formed therebetween is within the measurement range of the electro-optic voltage sensor; and
        an opening in the insulating body positioned between the first and second electrical conductors and adapted to receive the electro-optic voltage sensor such that the electro-optic voltage sensor is subjected to the electric field;
    a second insulating body having three openings, wherein a first opening is adapted to receive the insulating body, wherein the second opening is adapted to receive a bushing, and wherein a third opening is adapted to receive the cable; and
    a conductor adapted to electrically connect the first electrical conductor and the cable.

9. The separable connector as recited in claim 8, wherein the conductor includes a central conductor having two opposed ends, wherein one of the ends of the central conductor is positioned between the first and second openings of the first insulating body and has a hole passing therethrough, and wherein the other end of the central conductor extends into the third opening of the second insulating body and is adapted for connecting to a central conductor of the cable.

10. The separable connector as recited in claim 9, wherein the conductor further includes a stud having two threaded ends, wherein the hole in the end of the central conductor positioned between the first and second openings of the second insulating body is dimensioned to allow the stud to pass through the hole.

11. The separable connector as recited in claim 10, wherein the first electrical conductor is substantially positioned within the insulating body and comprises two opposed ends, wherein one of the two ends is adapted to receive one of the two threaded ends of the stud, and wherein the other end resides within the insulating body.

* * * * *